United States Patent
Lang et al.

(10) Patent No.: US 10,363,793 B2
(45) Date of Patent: Jul. 30, 2019

(54) HOUSING FOR ACCOMMODATION AND TEMPERATURE REGULATION OF AN ELECTRONIC DEVICE AND VEHICLE PROVIDED WITH SUCH HOUSING

(71) Applicant: Mekra Lang GmbH & Co. KG, Fuerth (DE)

(72) Inventors: Werner Lang, Ergersheim (DE); Stefan Bauer, Gerhardshofen (DE); Simon Deffner, Flachslanden (DE); Sebastian Heger, Bad Windsheim (DE); Matthias Zink, Ohrenbach (DE)

(73) Assignee: Mekra Lang GmbH & Co. KG, Ergersheim (DE)

( * ) Notice: Subject to any disclaimer, the term of this patent is extended or adjusted under 35 U.S.C. 154(b) by 1630 days.

(21) Appl. No.: 13/849,818

(22) Filed: Mar. 25, 2013

(65) Prior Publication Data
US 2013/0273824 A1 Oct. 17, 2013

(30) Foreign Application Priority Data

Mar. 27, 2012 (DE) .......... 10 2012 204 892

(51) Int. Cl.
*B60H 1/00* (2006.01)
*H05K 7/20* (2006.01)

(52) U.S. Cl.
CPC ..... *B60H 1/00271* (2013.01); *H05K 7/20863* (2013.01); *B60H 2001/003* (2013.01); *B60H 2001/00614* (2013.01)

(58) Field of Classification Search
CPC .......... B60H 1/00271; B60H 2001/003; B60H 2001/00614; H05K 7/20863
(Continued)

(56) References Cited

U.S. PATENT DOCUMENTS

| 3,859,899 A | 1/1975 | Mills ................................... 98/2 |
| 5,096,287 A | 3/1992 | Kakinami et al. ............ 352/132 |

(Continued)

FOREIGN PATENT DOCUMENTS

| DE | 20209591 U1 | 10/2002 |
| DE | 103 59 064 | 3/2005 |

(Continued)

OTHER PUBLICATIONS

JP2007196844A Machine English Translation, Aug. 2007.*
(Continued)

*Primary Examiner* — Gregory L Huson
*Assistant Examiner* — Dana K Tighe
(74) *Attorney, Agent, or Firm* — Imperium Patent Works; Darien K. Wallace

(57) ABSTRACT

A novel housing for an electronic device is located in the passenger compartment of a vehicle. The housing is used to maintain the temperature of the electronic device within its operating temperature range. The housing includes air inlets and outlets through which the temperature-regulated air current from the air conditioning system of the vehicle passes. The temperature-regulated air currents from the air conditioning system that are used to maintain a comfortable temperature in the passenger compartment are also used to regulate the temperature of the electronic device. Thus, the housing allows the temperature of the electronic device to be regulated exclusively using the air current from the air conditioning system. The air duct from the air conditioning system can be connected directly to the housing or can end a distance from the housing so that the air current from the duct is directed to strike the outside of the housing.

5 Claims, 4 Drawing Sheets

(58) Field of Classification Search
USPC ................ 454/127, 137, 139, 141, 142, 148
See application file for complete search history.

(56) References Cited

U.S. PATENT DOCUMENTS

| | | | | |
|---|---|---|---|---|
| 5,131,886 | A | | 7/1992 | Haustain ...................... 454/124 |
| 5,354,114 | A | * | 10/1994 | Kelman ............... B60H 1/0055 |
| | | | | 296/192 |
| 5,355,694 | A | | 10/1994 | Morrow et al. ................. 62/244 |
| 5,481,433 | A | | 1/1996 | Carter ........................... 361/690 |
| 5,706,170 | A | * | 1/1998 | Glovatsky ........... B60R 16/0215 |
| | | | | 174/377 |
| 5,760,828 | A | | 6/1998 | Cortes ........................... 348/143 |
| 5,979,540 | A | * | 11/1999 | Allison ............... B60H 1/00271 |
| | | | | 123/198 E |
| 6,902,473 | B1 | * | 6/2005 | Goobeck ............ B60H 1/00564 |
| | | | | 454/127 |
| 6,931,878 | B2 | * | 8/2005 | Kubota .............. B60H 1/00278 |
| | | | | 62/244 |
| 7,645,961 | B2 | | 1/2010 | Fernandez .................... 219/209 |
| 8,520,070 | B1 | * | 8/2013 | Englander ................ H04N 7/18 |
| | | | | 348/148 |
| 2002/0153750 | A1 | | 10/2002 | Feith et al. .................... 296/208 |
| 2005/0012039 | A1 | | 1/2005 | Faytlin et al. ................. 250/330 |
| 2006/0016588 | A1 | | 1/2006 | Haglsperger et al. ........ 165/202 |
| 2006/0132940 | A1 | | 6/2006 | MacDougall ................. 359/843 |
| 2007/0006999 | A1 | | 1/2007 | Lee ................................ 165/203 |
| 2007/0137235 | A1 | | 6/2007 | Heck et al. .................... 62/259.2 |
| 2007/0268025 | A1 | * | 11/2007 | Wilke ..................... G07C 5/008 |
| | | | | 324/639 |
| 2008/0055411 | A1 | | 3/2008 | Lee ................................ 348/148 |
| 2008/0297136 | A1 | * | 12/2008 | Gaboury ............ B60H 1/00278 |
| | | | | 324/76.11 |
| 2010/0202052 | A1 | | 8/2010 | Sharma ......................... 359/512 |
| 2011/0134601 | A1 | * | 6/2011 | Sa .......................... G06F 1/1632 |
| | | | | 361/679.43 |
| 2011/0165830 | A1 | * | 7/2011 | Smith ................ B60H 1/00278 |
| | | | | 454/75 |
| 2011/0165832 | A1 | * | 7/2011 | Smith ................ B60H 1/00278 |
| | | | | 454/139 |

FOREIGN PATENT DOCUMENTS

| | | | | |
|---|---|---|---|---|
| DE | 102004028740 | | 1/2006 | |
| DE | 102007011623 | | 6/2008 | |
| DE | 102007032852 | | 8/2008 | |
| DE | 102007029635 | | 1/2009 | |
| EP | 0711681 | A1 | 5/1996 | |
| GB | 2343164 | | 5/2000 | |
| JP | 63155488 | | 6/1988 | |
| JP | 1997-504494 | | 5/1997 | |
| JP | H10-048564 | | 2/1998 | |
| JP | H11-163567 | | 6/1999 | |
| JP | 2002-254920 | | 9/2002 | |
| JP | 2003-025875 | | 1/2003 | |
| JP | 2004-268629 | | 9/2004 | |
| JP | 2004-274830 | | 9/2004 | |
| JP | 2007196844 | A * | 8/2007 | ............... B60R 1/00 |
| WO | WO 8304225 | | 12/1983 | |

OTHER PUBLICATIONS

Search Report of the European Patent Office in foreign counterpart application EP13161180.8 dated Jul. 2, 2013 citing references A-E (6 pages).
Office Action from the German Patent Office dated Nov. 14, 2012 in related German application DE102012204892.8 citing documents A-D (5 pages).
Office action dated Jun. 2, 2015 from the Japanese Patent Office in foreign counterpart application JP 2013-062468 citing references A-J (6 pages) and English translation of Japanese Office action.

* cited by examiner

HOUSING FOR ACCOMMODATION AND TEMPERATURE REGULATION OF AN ELECTRONIC DEVICE AND VEHICLE PROVIDED WITH SUCH HOUSING

CROSS REFERENCE TO RELATED APPLICATION

This application is based on and hereby claims the benefit under 35 U.S.C. § 119 from German Patent Application No. DE 102012204892.8, filed on Mar. 27, 2012, in the German Patent Office. This application is a continuation-in-part of German Patent Application No. DE 102012204892.8, the contents of which is incorporated herein by reference.

TECHNICAL FIELD

The present invention relates to a housing for accommodating and regulating the temperature (tempering) of an electronic device and a vehicle provided with the housing that is located at a predetermined position in the passenger compartment of the vehicle.

BACKGROUND

Electronic devices work reliably only when they are at their respective operating temperatures, where "operating temperature" actually describes an allowed temperature "range" in which the electronic device works optimally, i.e., without suffering any damage and in a high efficiency manner. Working reliably is indispensable especially in cases of an electronic device located in the passenger compartment of a vehicle and used to promote driving safety. Maintaining the allowed operating temperature range is achieved by a temperature regulating device, even in extreme situations such as during the summer, when the vehicle is exposed to the sun for a relative long time and the temperature of the electronic device becomes high, usually to the same temperature as in the passenger compartment. The same is true, mutatis mutandis, in the case of cold weather, when the temperature in the passenger compartment and thereby the temperature of the electronic device falls below the operating temperature range of the electronic device.

A system is sought that reliably and efficiently maintains the temperature of electronic device in the passenger compartment of a vehicle within the operating temperature range of the electronic device.

SUMMARY

A vehicle with a passenger compartment has an air conditioning system adapted to create temperature-regulated air currents within the passenger compartment. A housing located at a predetermined position within the passenger compartment is adapted to accommodate an electronic device and includes at least one air inlet and at least one air outlet through which a temperature-regulated air current of the air conditioning system passes. The vehicle is characterized in that the temperature-regulation of the electronic device is performed exclusively using the air conditioning system.

A novel housing for an electronic device is located in the passenger compartment of a vehicle. The electronic device can be an indirect vision system or a mobile device, such as a portable navigation device or a cell phone. The housing is used to maintain the temperature of the electronic device within the optimal operating temperature range of the device. The housing includes an air inlet and an air outlet through which the temperature-regulated air current from the air conditioning system of the vehicle passes. The temperature-regulated air currents from the air conditioning system that are used to maintain a comfortable temperature within the passenger compartment are also used to regulate the temperature of the electronic device. Thus, the housing allows the temperature of the electronic device to be regulated exclusively using the air current from the air conditioning system. The air duct from the air conditioning system can be connected directly to the housing, or the air duct can end a distance away from the housing, and the air current from the air duct can then be directed to strike the outside of the housing.

The housing can be located in an A-pillar of the vehicle or on the dashboard panel of the vehicle. In one implementation, the air outlet of the housing is oriented such that the air current exiting the housing strikes a window of the vehicle. The housing is either integrally connected to a part of the vehicle or is detachably connected to a part of the vehicle. For example, the electronic device can be an indirect vision system that is fixed in the housing and is located in a field of view of a driver of the vehicle. In addition, the electronic device can be fixed in the housing or can be detachable from the housing. For example, the housing can function as a docking station into which a mobile electronic device is plugged.

In another embodiment, a system includes the novel housing, an air duct and an indirect vision system. The indirect vision system is located inside the housing. A temperature-regulated air current from an air conditioning system of a vehicle passes through the air duct. The housing includes an air inlet and an air outlet through which the temperature-regulated air current passes. The housing is not a part of the air conditioning system. The temperature of the indirect vision system is regulated using the air current from the air conditioning system. Thus, the temperature regulation is performed exclusively by the air conditioning system because the housing does not include any regulating means, such as adjustable flaps or shutters. In one implementation, the air outlet is oriented such that the air current exiting the housing strikes a window of the vehicle to heat and defog the window.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
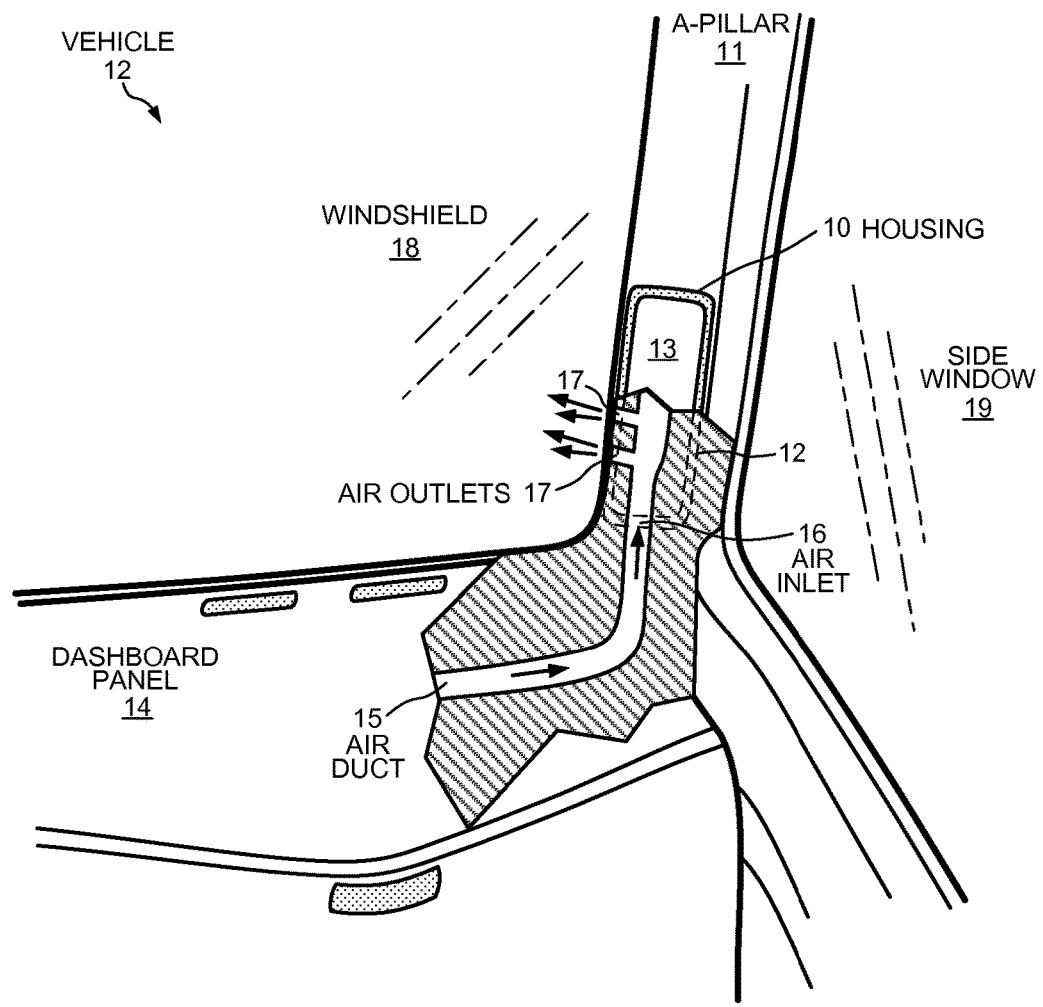
FIG. 1 shows a part of a vehicle including a housing according to a first embodiment of the present invention.
Figure 2:
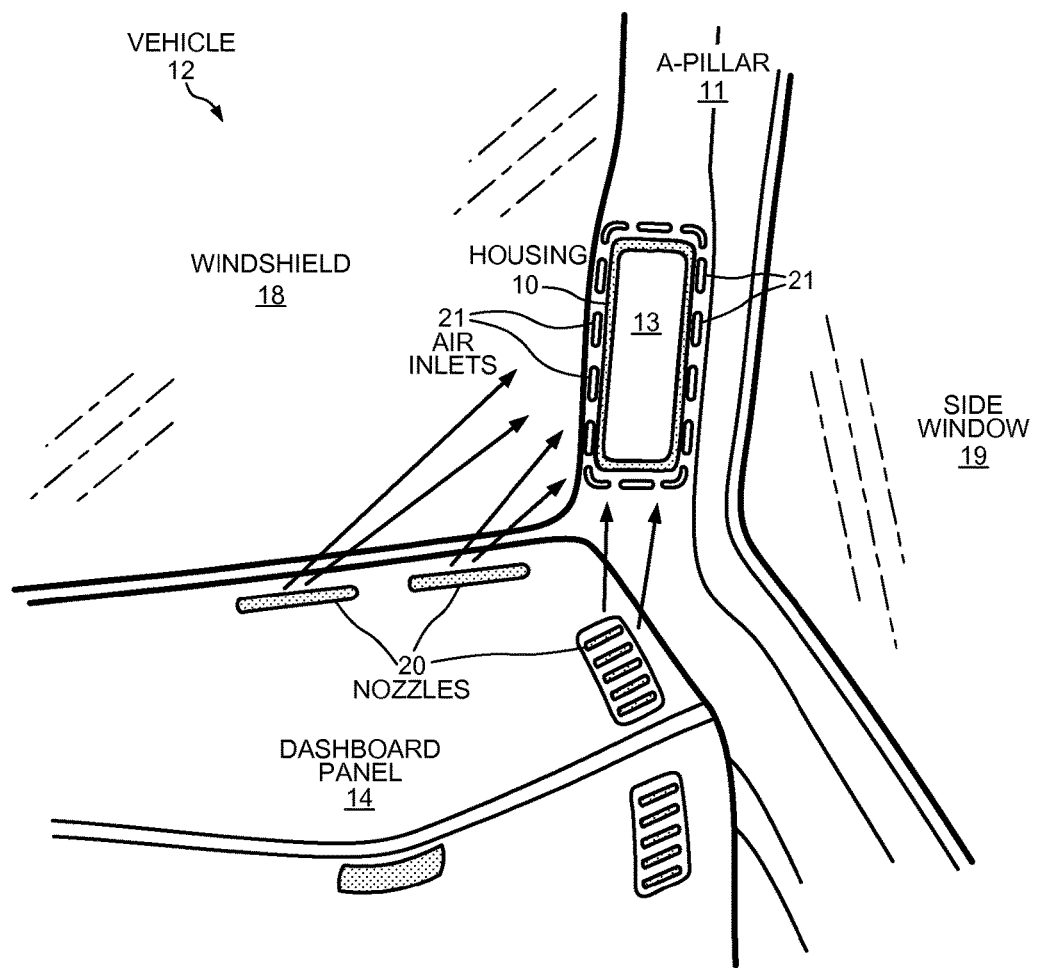
FIG. 2 shows a part of a vehicle including a housing according to a second embodiment of the present invention.
Figure 3:
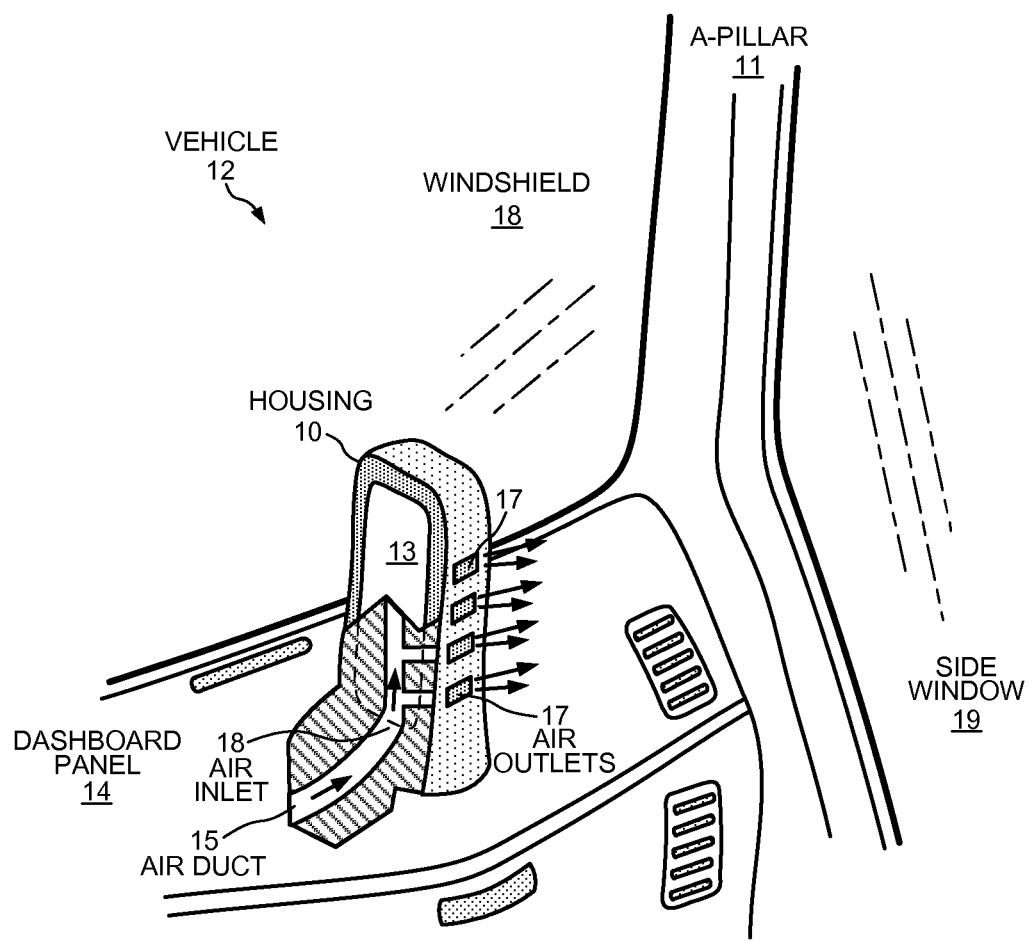
FIG. 3 shows a part of a vehicle including a housing according to a third embodiment of the present invention.
Figure 4:
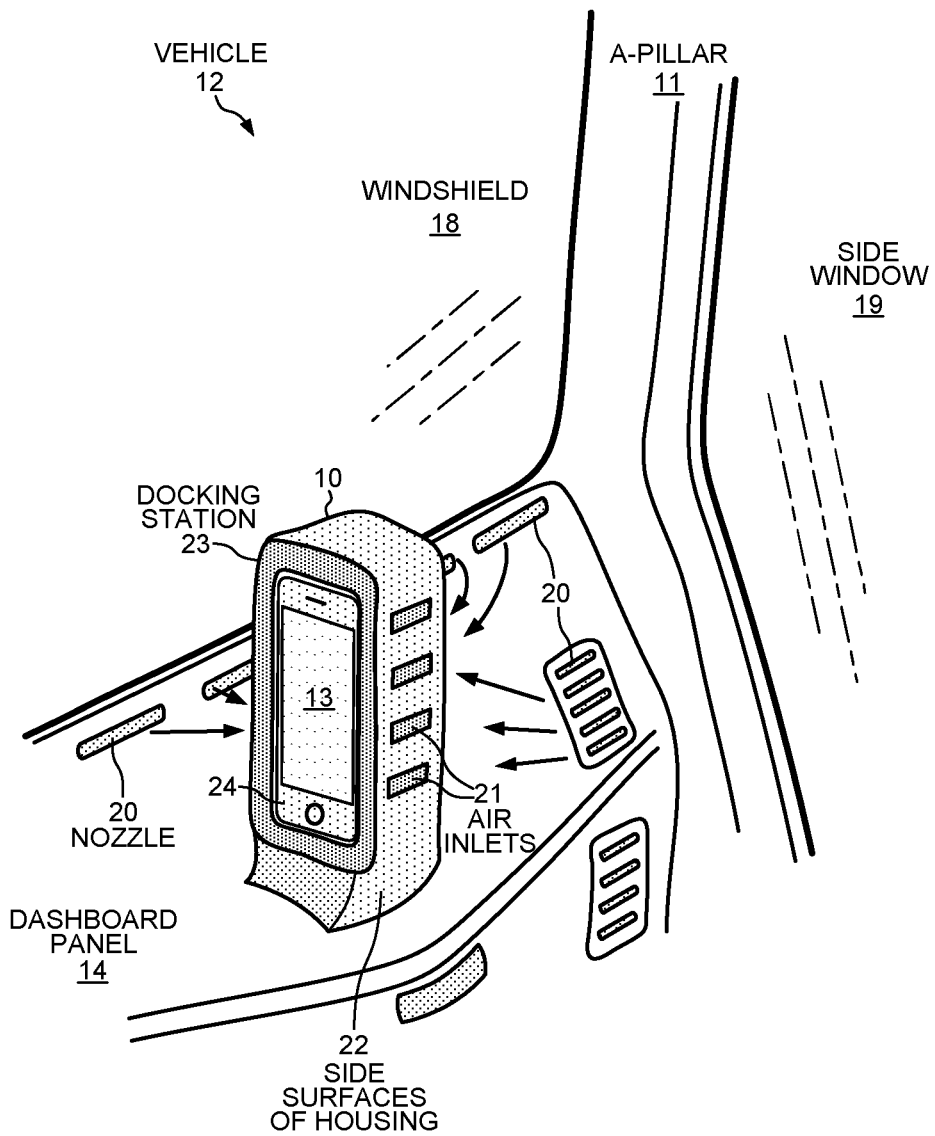
FIG. 4 shows a part of a vehicle including a housing according to a fourth embodiment of the present invention.

FIGS. 1 and 2 show housing 10 mounted into an A-pillar 11 of a vehicle 12. Only a portion around the lower end of the A-pillar 11 is shown in FIGS. 1 and 2. An electronic device 13 is accommodated in the housing 10 in the lower end of the A-pillar 11. FIGS. 3 and 4 illustrate embodiments in which the housing 10 is attached to a dashboard panel 14 of the vehicle 12. FIGS. 1 and 3 each show an air duct 15 that is part of an air conditioning system of the vehicle 12. The air duct 15 is fluidly connected to the housing 10 and forms an airtight connection to the housing 10. An air current is guided into the housing 10 through the air duct 15, enters the housing 10 through an air inlet 16, and exits the housing 10 through several air outlets 17. As can be seen in FIGS. 1 and 3, the air current flows on the one hand towards the windshield 18 (FIG. 1) and on the other hand towards a side window 19 (FIG. 3) through the air outlets 17 out of the housing 10. According to the embodiment of FIG. 3, the housing 10 is connected integrally to the dashboard panel 14.

In each of the embodiments shown in FIGS. 2 and 4, the air current is not directly coupled into the housing 10 as in the embodiments of FIGS. 1 and 3 because the air duct 15 does not form an airtight connection with the housing 10. Instead, the air current strikes the outside of the housing 10 because there is a distance between the end of the air duct 15 and the housing 10. The air current exits from a nozzle 20 that forms an end of the air duct 15. The air current exiting the nozzles 20 is directed in a defined way towards the housing 10. Alternatively, the air current exits from the ends of multiple air ducts 15 of the air conditioning system.

In FIG. 2, air inlets 21 are formed along part of the circumference of the housing 10. In FIG. 4 the air inlets 21 are formed on the side surfaces 22 (only one side surface is visible in FIG. 4). As can be seen when comparing FIGS. 3 and 4, the housing 10 in the embodiment of FIG. 4 is not connected integrally to the dashboard panel 14, but rather is detachably connected to the dashboard.

It should be noted that none of the housings 10 according to embodiments 1 through 4 is equipped with any active heating or cooling element able to take part in the temperature-regulation of the electronic device 13.

The novel housing 10 of the present invention both accommodates the electronic device 13 and regulates the temperature of the electronic device 13. The novel housing allows exclusively already-existing resources of the vehicle 12 to be used for economically regulating the temperature. A vehicle provided with the novel housing also falls within the scope of the invention. The vehicle includes a passenger compartment, an air conditioning system adapted to create temperature-regulated air currents within the passenger compartment, and a housing located at a predetermined position within the passenger compartment. The housing 10 is adapted to accommodate the electronic device 13 and includes at least one air inlet 16, 21 and at least one air outlet 17 that allow a temperature-regulated air current from the air conditioning system to pass through the housing 10. Temperature-regulation of the electronic device 13 is carried out exclusively by the temperature-regulation performed by the air conditioning system.

The temperature of the electronic device 13 is regulated exclusively by cooling or heating air currents received from the air conditioning system and by regulating the flow rate or air mass per unit time of these air currents transporting heat from or to the electronic device by convection. To this end, preferably a temperature-regulated, i.e., heated or cooled, air current is guided through the housing. "Temperature regulation" is generic and includes both closed loop control and open loop control (i.e., a manual presetting of the temperature). The novel housing may be added to a new vehicle already in the development phase, or the housing may be used to retrofit an already existing vehicle. Effective temperature regulation of the electronic device is thus achieved with high efficiency and by using as little as possible of the vehicle's resources by using (a) the temperature-regulated air currents provided by the air conditioning system, (b) the housing as a guiding means that guides the air currents through and/or around the electronic device, and (c) the arrangement (position and orientation) of the electronic device. The temperature regulation of the electronic device is performed exclusively by the air conditioning system because the housing does not include any regulating means, such as adjustable flaps or shutters or the like. Because the housing is not a part of the air conditioning system but rather is temperature regulated by the air conditioning system, the temperature-regulation of the electronic device is carried out exclusively by the temperature-regulation means of the air conditioning system.

FIG. 1 shows the first embodiment in which the air duct 15 of the air conditioning system of the vehicle 12 is permanently connected to the housing 10. In comparison, FIG. 2 shows the second embodiment in which the air current is directed against (i.e., strikes) the housing 10 from the outside. An advantage of the first embodiment lies in the higher efficiency of the cooling/heating because all (100%) of the air current coming out of the air duct 15 enters the housing 12 and is available for temperature-regulating the electronic device 13. An advantage of the second embodiment is structural (and therefore also financial) because the air duct 15 does not need to extend all the way to the housing 10. There is a non-zero distance between the housing 10 and the end of the air duct 16 arranged below the dashboard panel 14 (where the air current enters the passenger compartment of the vehicle 12). In the second embodiment, the end of the air duct 15 is equipped with nozzles 20 that determine (a) the direction and (b) the flow characteristics of the air current. The location of the housing 10 inside the passenger compartment is flexible because the direction at which the air current is directed in (a) can be adjusted. In addition, the efficiency of the cooling/heating of the housing 10 can be optimized by adjusting the flow characteristics in (b). Thus, the temperature and flow rate of the air current and the configuration of the housing are factors that influence the efficiency of the cooling/heating of the housing 10.

In some embodiments, the predetermined location of the housing 10 is in an A-pillar 11 of the vehicle 12. Irrespective of the function of the electronic device 13, an advantage of this location for the housing 10 is that air ducts that extend to the side ends of the dashboard or its panel and that usually direct air currents towards and against the windshield 18 and/or the side window 19 of the vehicle 12 are commonly already provided. This advantage is especially applicable to the second embodiment of FIG. 2 because the existing A-pillar 11 only either has to be adapted in such a way that the housing can be accommodated therein (the above-mentioned development phase) or exchanged for an A-pillar especially designed for this purpose (the above-mentioned retrofitting). Alternatively, the A-pillar 11 can be manufactured for a later optional built-in of the inventive housing 10. The air conditioning system either does not have to be changed at all or only requires changing of the nozzles 20 to improve the air flow towards the housing 10.

Furthermore, in the first embodiment of FIG. 1, merely an appropriate extension of the air duct 16 is needed. Thus, retrofitting a vehicle with a housing 10 according to the present invention or a redesigning a vehicle into a vehicle according to the invention is very economical. As is explained further below, it is possible that the electronic device 13 includes a liquid crystal display (LCD) or some other display. In such a case, the position of the housing 10 in the A-pillar 11 is advantageous because the information displayed can be seen by the driver as well as by the front-seat passenger. In which one of the vehicle's A-pillars the housing is arranged depends on the electronic device 13 itself. For example, if the electronic device 13 is a monitor that complements a customary rear view mirror by providing a view of a blind angle, the housing 10 is preferably arranged in the right A-pillar 11 because it is easy for the driver to view the blind angle on the left side of the vehicle 12 by simply turning his head. An appropriate recess may be provided or generated in the A-pillar 11 into which the housing 10 can be fitted, or the housing can be designed as its own pillar or as a recess into which the electronic device 13 can be fitted.

In another embodiment, the predetermined position of the housing 10 is on the dashboard panel 14 of the vehicle 12. This position lies in the immediate vicinity of air ducts 15 that usually already exist. So redesigning a vehicle to include the novel housing 10 or retrofitting an existing vehicle is economical.

The housing 10 can either be integrally attached to an element of the vehicle, or the housing 10 can be detachably connected to an element of the vehicle. An "element" of the vehicle can be a panel of an A-pillar 11 or the dashboard panel 14 of the vehicle. The housing and the element to which it is attached may be integrally connected to each other or made as a single piece through an injection molding process, for example. Furthermore, the housing 10 is connected "detachably" to the element of the vehicle 12 if the housing 10 can either (a) be attached to and removed (i.e., detached) from the element in a non-destructive way with an appropriate tool for repair or maintenance reasons, or (b) can be attached to the element by plugging in or locking or the like. If the housing, for instance, is attached above the center console of the dashboard panel 14 and accommodates an integrated electronic device 13 having a display, it is advantageous to make the connection pivotable so that the display can be oriented towards either the driver or the front-seat passenger. In this case, different air ducts are automatically chosen, for example by turning the housing, so as to enable optimal flow towards and against the housing in any position. In the case of a direct connection between the air duct 16 and the housing 10, such a mechanism is not required. Alternatively, it is possible to design the housing 10 in such a way that it can be effectively passed through by the air currents from different sides, thereby requiring only a single air duct that is directed onto different surfaces 22 of the housing 10.

In another embodiment, the inside temperature of the housing 10 is variably controllable for establishing the operating temperature. The temperature of the electronic device 13 is regulated by using the housing 10 that accommodates the electronic device as a means for guiding the flow of the air currents. Because the temperature of the housing depends on several factors, such as the position of the housing within the passenger compartment, the weather conditions, i.e., especially the incident solar radiation, the insulation and the surface coating of the housing, the inside temperature of the housing is detected and used as a controlled variable of the closed loop for a reliable temperature-regulation. A temperature sensor required for that purpose is located in the air flow shadow of the electronic device 13 inside the housing 10 to avoid incorrect temperature measurements caused by hysteresis, for example when the sensor is cooled or heated faster by the air current than is the electronic device. The sensor is located on an especially temperature-sensitive part of the electronic device.

In another embodiment, the electronic device 13 is an indirect vision system located in the field of view of a driver of the vehicle 12. The indirect vision system is adapted to replace or complement a conventional rear view mirror. Preferably the indirect vision system is connected to one or more in-vehicle or on-board cameras that capture predetermined fields of view. If the indirect vision system is connected to more than one of such camera, the indirect vision system can switch between the different fields of view, or the different fields of view are arranged next to each other on the display of the indirect vision system. Alternatively, the electronic device 13 may be a separate navigation device or a navigation devise in addition to the indirect vision system.

In the embodiments of FIGS. 1 and 3, at least one air outlet 17 from the housing 10 is located in such a way that the air current exiting the housing strikes a window of the vehicle, such as the windshield 18 in FIG. 1 or the side window 19 in FIG. 3. The air current is guided through the housing 10 and deflected inside of the housing, causing the air current to strike or flow against the window. For example, when the vehicle 12 is started after a relatively long stop at an outside temperature below 0° C., and therefore at substantially the same temperature inside the vehicle, it is important for driving safety first to warm up the electronic device 13 to its operating temperature, which has priority. The electronic device 13 is warmed up by heating the air current guided into the housing 10 more intensively than the air current guided directly into the passenger compartment that does not pass through the housing. Because the temperature of the air current is chosen as high as possible (but not higher than the maximum of the operating temperature) in order to ensure arriving at the operating temperature as fast as possible, the temperature of the air current after having passed through the housing is still higher than the temperature of the air current for direct heating of the passenger compartment, despite thermal dissipation to the electronic device. This relatively high temperature of the air current that is directed towards a window of the vehicle has the advantage that the view through the directly struck window is improved very quickly.

In the embodiments of FIGS. 1 and 3, the air conditioning system is fluidly connected to the air inlet 16 of the housing 10. That is, the air duct extends to the housing 10 and tightly connected to the housing in an airtight manner. The housing 10 comprises only one air inlet 16 whose size matches the size of the end of the air duct 15. In this way, the entire air current is lead into the housing and used for temperature regulation. As the amount of heat thereby transferred is maximal, the efficiency is 100%. The air inlet 16 has a cross-section that decreases in area moving towards the inside of the housing 10. This has the advantage that an amount of the air current as large as possible is caught and directed into the inside of the housing in an "air duct effect." The cross-section is advantageously formed in such as way that inside the housing, an air knife of a laminar air flow is created. The air inlet 16 is oriented with respect to the overall housing in such a way that the air current flows around the electronic device 13 or is directed to temperature-sensitive parts of the electronic device.

In the embodiments of FIGS. 2 and 4, several air inlets 16 are arranged along the boundary of the housing 10. A gap is formed between the electronic device 13 and the housing 10 as part of the flow path of the air current passing through the housing. Several air inlets 21 are arranged in the gap along the edge of the housing 10 so as to achieve an optimal air flow around the electronic device 13.

The electronic device 13 can be permanently attached to the housing 10. Alternatively, the housing can be formed as a docking station 23 into which a detachable electronic device, such as a mobile phone, portable navigation device or other mobile device 24, is plugged in or coupled to the docking station 23, as shown in FIG. 4. The removability of the mobile electronic device provides both exchangeability and theft-protection. Exchangeability in turn means that the system may be used modularly. Multiple people who alternately use the vehicle 12 may insert their individual electronic devices containing personal data and settings.

REFERENCE SIGN LIST 10 housing
11 A-pillar
12 vehicle
13 electronic device
14 dashboard panel
15 air duct
16 air inlet
17 air outlet
18 windshield
19 side window
20 nozzles
21 air inlet
22 side surface of 10

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A vehicle comprising:
a passenger compartment;
an air conditioning system that guides a temperature-regulated air current through a duct and into the passenger compartment; and
a housing located at a predetermined position within the passenger compartment, wherein the housing is adapted to accommodate an electronic device having a temperature, wherein the housing includes an air inlet and an air outlet through which the temperature-regulated air current from the duct passes, wherein the temperature of the electronic device is regulated exclusively by guiding the air current from the duct around the electronic device; and
wherein the air current exiting the duct strikes the outside of the housing.

2. A vehicle comprising:
a passenger compartment;
an air conditioning system that guides a temperature-regulated air current through a duct and into the passenger compartment; and
a housing located at a predetermined position within the passenger compartment, wherein the housing is adapted to accommodate an electronic device having a temperature, wherein the housing includes an air inlet and an air outlet through which the temperature-regulated air current from the duct passes, wherein the temperature of the electronic device is regulated exclusively by guiding the air current from the duct around the electronic device; and
wherein the predetermined position is in an A-pillar of the vehicle.

3. A vehicle comprising:
a passenger compartment;
an air conditioning system that guides a temperature-regulated air current through a duct and into the passenger compartment; and
a housing located at a predetermined position within the passenger compartment, wherein the housing is adapted to accommodate an electronic device having a temperature, wherein the housing includes an air inlet and an air outlet through which the temperature-regulated air current from the duct passes, wherein the temperature of the electronic device is regulated exclusively by guiding the air current from the duct around the electronic device; and
wherein the housing is integrally connected to a part of the vehicle.

4. A system comprising:
an air duct, wherein a temperature-regulated air current from an air conditioning system passes through the air duct;
a housing; and
an electronic device held by the housing, wherein the electronic device has a temperature, wherein the housing includes an air inlet and an air outlet through which the temperature-regulated air current from the air duct passes, wherein the temperature of the electronic device is regulated exclusively by guiding the air current from the duct around the electronic device; and
wherein the air current exiting the duct strikes an outside surface of the housing.

5. A system comprising:
an air duct, wherein a temperature-regulated air current from an air conditioning system passes through the air duct;
a housing; and
an electronic device held by the housing, wherein the electronic device has a temperature, wherein the housing includes an air inlet and an air outlet through which the temperature-regulated air current from the air duct passes, wherein the temperature of the electronic device is regulated exclusively by guiding the air current from the duct around the electronic device; and
wherein the housing is an integral part of a vehicle.

* * * * *